United States Patent
Huang

(10) Patent No.: US 7,220,618 B2
(45) Date of Patent: May 22, 2007

(54) METHOD FOR FORMING A REDISTRIBUTION LAYER IN A WAFER STRUCTURE

(75) Inventor: Min-Lung Huang, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 11/099,172

(22) Filed: Apr. 5, 2005

(65) Prior Publication Data

US 2006/0057772 A1 Mar. 16, 2006

(30) Foreign Application Priority Data

Apr. 9, 2004 (TW) .............................. 93110006 A

(51) Int. Cl.
*H01L 21/44* (2006.01)

(52) U.S. Cl. ................................ 438/108; 257/E27.137

(58) Field of Classification Search .................. 438/15, 438/25–26, 55, 64, 106–109, 117, 128, 238, 438/281, 612–614, 683–688
See application file for complete search history.

(56) References Cited

U.S. PATENT DOCUMENTS 6,492,198 B2* 12/2002 Hwang .................. 438/108
6,743,660 B2* 6/2004 Lee et al. ................ 438/108
2002/0096764 A1* 7/2002 Huang ..................... 257/737
2004/0004284 A1* 1/2004 Lee et al. ................ 257/737
2004/0043538 A1* 3/2004 Lo et al. .................. 438/117
2004/0166662 A1* 8/2004 Lei ......................... 438/614
2005/0020047 A1* 1/2005 Mis et al. ................ 438/597
2005/0054155 A1* 3/2005 Song et al. .............. 438/238
2005/0104228 A1* 5/2005 Rigg et al. ............... 257/786

OTHER PUBLICATIONS

Peter Van Zant, "Microchip Fabrication", 2004, , McGraw Hill, 5th edition, pp. 412-413.*

* cited by examiner

*Primary Examiner*—Michael Lebentritt
*Assistant Examiner*—Andre' Stevenson
(74) *Attorney, Agent, or Firm*—Ladas and Parry LLP

(57) ABSTRACT

The present invention relates to a method for forming a redistribution layer in a wafer structure. The method comprises: (a) providing a wafer having a plurality of conductive structures and a first passivation layer thereon, wherein the first passivation layer covers the wafer except the conductive surfaces of the conductive structures; (b) forming a second passivation layer over the first passivation layer; (c) selectively removing part of the second passivation layer to form a plurality of grooves corresponding to a predetermined circuit; (d) forming a redistribution layer in the grooves; and (e) forming a third passivation layer over the second passivation layer and the redistribution layer. As a result, the redistribution layer is "embedded" in the second passivation layer so as to avoid the delamination of the redistribution layer.

15 Claims, 9 Drawing Sheets

METHOD FOR FORMING A REDISTRIBUTION LAYER IN A WAFER STRUCTURE

BACKGROUND OF THE INVENTION

1. Field of the Invention

The present invention relates to a method for forming a redistribution layer in a wafer structure, particularly to a method for embedding redistribution layer in the passivation layer of the wafer structure.

2. Description of the Related Art

FIG. 1 shows a cross sectional view of a conventional wafer structure. The conventional wafer structure 10 comprises a wafer 11, a plurality of bonding pads 12, a first passivation layer 13, a redistribution layer 14, a second passivation layer 15, an under bump metallurgy layer 16 and a solder bump 17.

The bonding pads 12 are disposed on a surface of the wafer 11, and the material of the bonding pads 12 is usually aluminum, copper or the like. The first passivation layer 13 covers the wafer 11 and part of each bonding pads 12 so as to expose a conductive surface on each bonding pads 12. That is, the first passivation layer 13 does not cover the top surfaces of the bonding pads 12 completely. The material of the first passivation layer 13 is usually benzocyclobutene (BCB), polyimide (PI) or the like. The redistribution layer 14 is disposed over the first passivation layer 13 and is used for electrically connecting the bonding pads 12 and the under bump metallurgy layer 16. The material of the redistribution layer 14 is usually aluminum or the like. The second passivation layer 15 is disposed over the first passivation layer 13 and is used for protecting the redistribution layer 14. The material of the second passivation layer 15 is usually benzocyclobutene (BCB), polyimide (PI) or the like. The under bump metallurgy layer 16 is disposed on a predetermined location and has the solder bump 17 thereon. The under bump metallurgy layer 16 includes an adhesion layer, a barrier layer and a wetting layer (not shown), and is used for enhancing the attachment between the solder bump 17 and the redistribution layer 14. The material of the solder bump is usually tin/lead alloy.

FIGS. 2a to 2m show a conventional method for forming a redistribution layer in the wafer structure 10 of FIG. 1. The conventional method is described as follows. First, a wafer 11 having a plurality of bonding pads 12 is provided, as shown in FIG. 2a. A first passivation layer 13 is then formed on the wafer 11 to protect the wafer 11 by coating or deposition. The first passivation layer 13 does not cover the top surfaces of the bonding pads 12 completely but exposes the conductive surface 121 of the bonding pads 12, as shown in FIG. 2b. Then, a conductive layer 14a is formed over the first passivation layer 13 and the bonding pads 12 by sputtering, as shown in FIG. 2c. The conductive layer 14a is patterned according to the following steps. A photoresist film is applied to the conductive layer 14a and is exposed and developed to form a patterned photoresist film that serves as a mask. Then, the conductive layer 14a is selectively removed by wet etching to form the redistribution layer 14, as shown in FIG. 2d. Then, the second passivation layer 15 is formed by coating or deposition on the redistribution layer 14 to protect the redistribution layer 14, as shown in FIG. 2e. The second passivation layer 15 is selectively removed by utilizing exposing and development technique so as to have a plurality of openings 151 and expose part of the redistribution layer 14, as shown in FIG. 2f. Then, a conductive layer 16a is formed over the second passivation layer 15 by sputtering, as shown in FIG. 2g.

A photoresist film, for example, a dry film or a liquid photo resist layer, is applied to the conductive layer 16a. By an appropriate way, for example, patterning, a plurality of openings are defined on the photoresist film. The photoresist film is selectively removed so that a patterned photoresist film 18 remains on the opening 151, as shown in FIG. 2h. Then, the conductive layer 16a is patterned by etching according to the mask of patterned photoresist film 18. For example, part of the conductive layer 16a is removed by wet etching, and the conductive layer 16a on the opening 151 remains to form the under bump metallurgy layer 16, then the patterned photoresist film 18 is stripped, as shown in FIG. 2i.

Referring to FIG. 2j, the entire surface is covered by another photoresist film 181 on which an opening 182 corresponding to the solder bump 17 is formed by patterning. Then, a silver paste 19 is filled in the opening 182 by screen printing, as shown in FIG. 2k. The solder bump 17 is made of the silver paste 19 after reflow, as shown in FIG. 2l. Finally, the conventional wafer structure 10 is formed after the photoresist film 181 is stripped, as shown in FIG. 2m.

A shortcoming of the conventional wafer structure 10 is that the redistribution layer 14 is on the surface of the first passivation layer 13, which will cause delamination easily. That is, the redistribution layer 14 cannot be fixed on the first passivation layer 13 tightly due to the poor attachment therebetween. Thus, the performance of the redistribution layer 14 will be reduced, and moreover, the packaging may fail.

Consequently, there is an existing need for a novel and improved method for forming a redistribution layer in a wafer structure to solve the above-mentioned problem.

SUMMARY OF THE INVENTION

One objective of the present invention is to "embed" the redistribution layer in a passivation layer so that the redistribution layer is fixed in a passivation layer tightly and the delamination of the redistribution layer can be avoided.

Another objective of the present invention is to provide a method for forming a redistribution layer in a wafer structure comprising:
(a) providing a wafer having a plurality of conductive structures and a first passivation layer thereon, wherein the first passivation layer covers the wafer except the conductive surfaces of the conductive structures;
(b) forming a second passivation layer over the first passivation layer;
(c) selectively removing part of the second passivation layer to form a plurality of grooves corresponding to a predetermined circuit, wherein the grooves expose the conductive surfaces of the conductive structures;
(d) forming a redistribution layer in the grooves; and
(e) forming a third passivation layer over the second passivation layer and the redistribution layer.

DETAILED DESCRIPTION OF THE INVENTION

Figure 1:
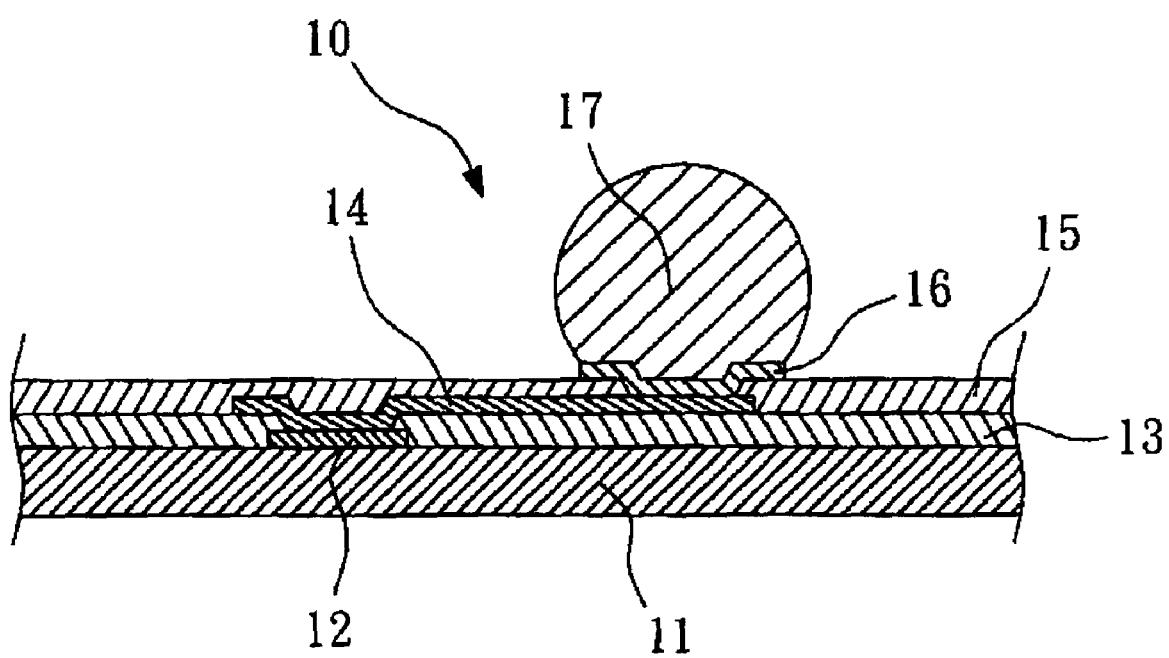
FIG. 1 shows a cross sectional view of a conventional wafer structure.
Figure 2A:
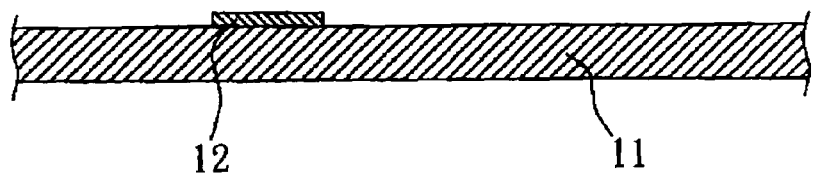
FIGS. 2a to 2m show a conventional method for forming a redistribution layer in the wafer structure of FIG. 1.
Figure 2B:
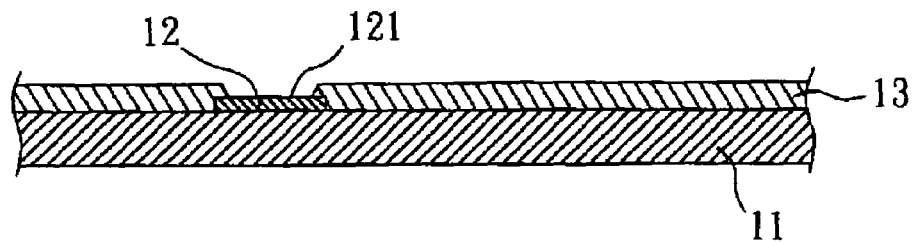
Figure 2C:
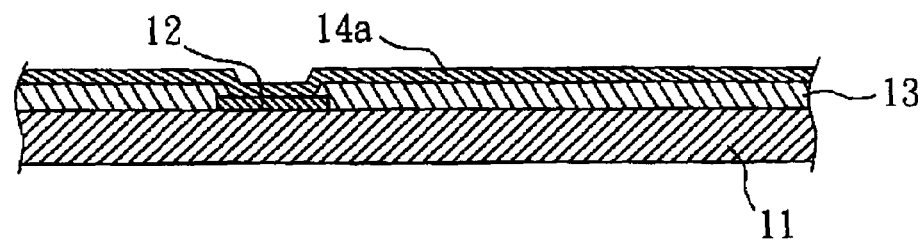
Figure 2D:
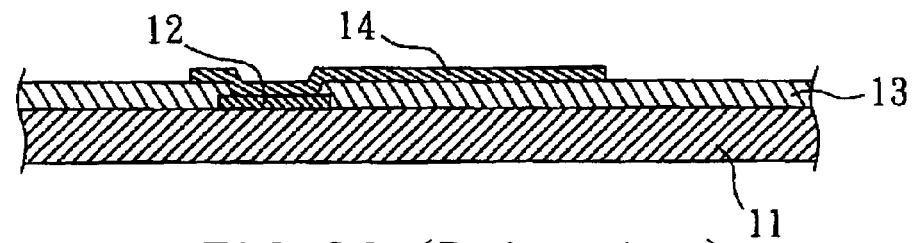
Figure 2E:
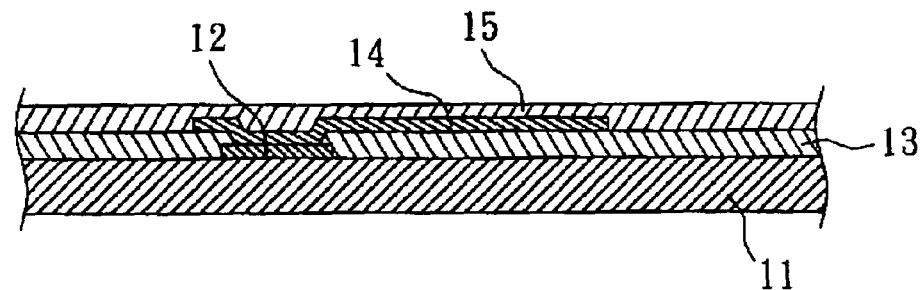
Figure 2F:
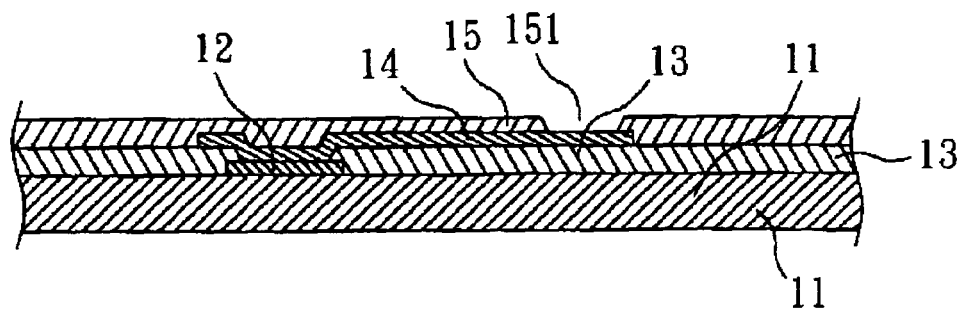
Figure 2G:
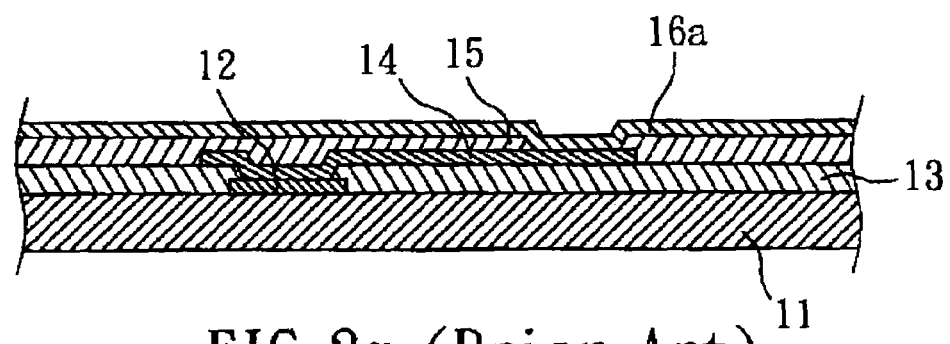
Figure 2H:
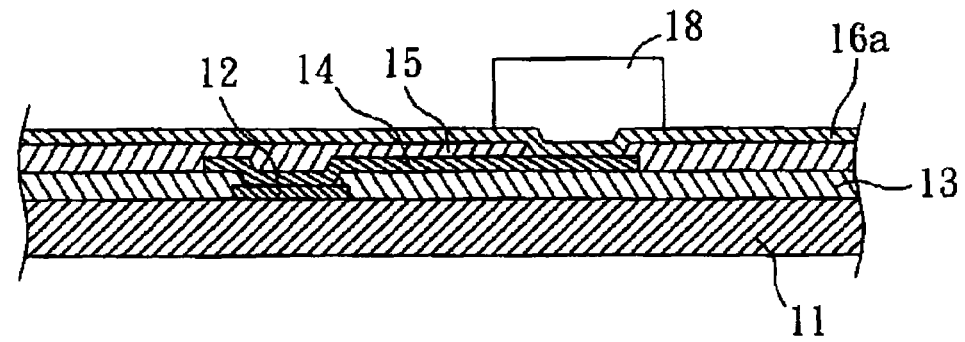
Figure 2I:
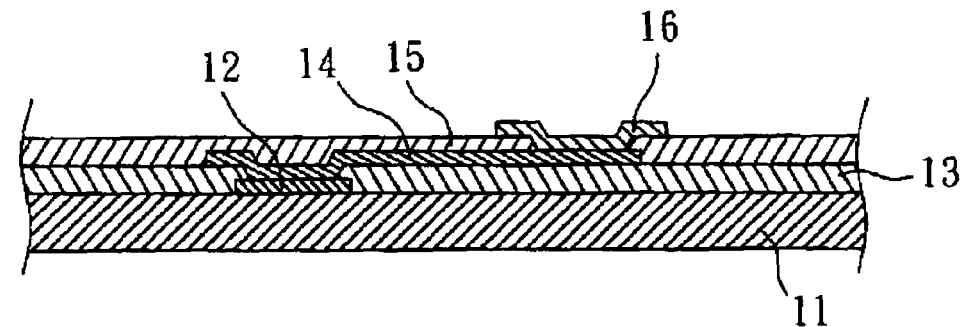
Figure 2J:
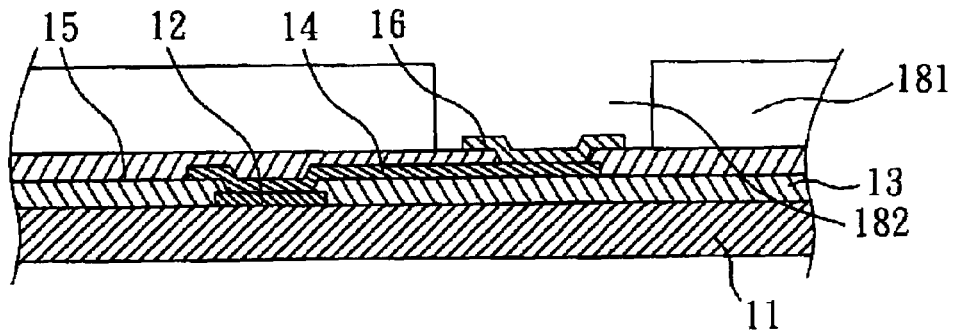
Figure 2K:
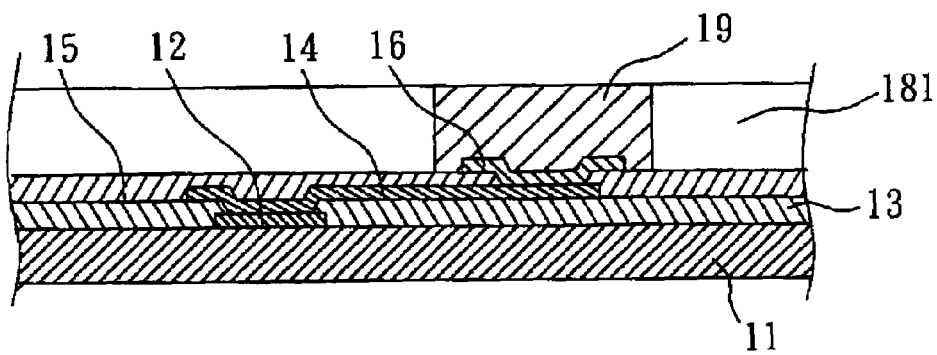
Figure 2L:
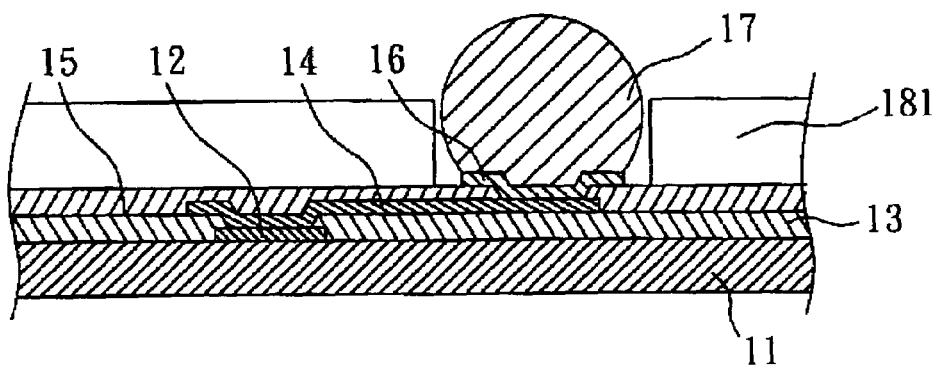
Figure 2M:
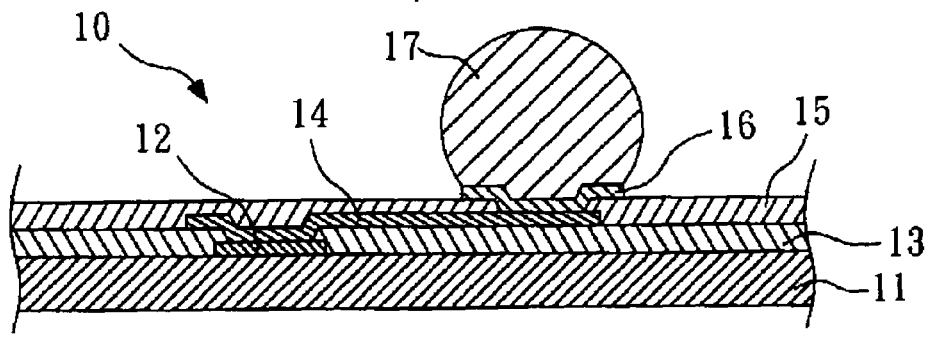
Figure 3A:
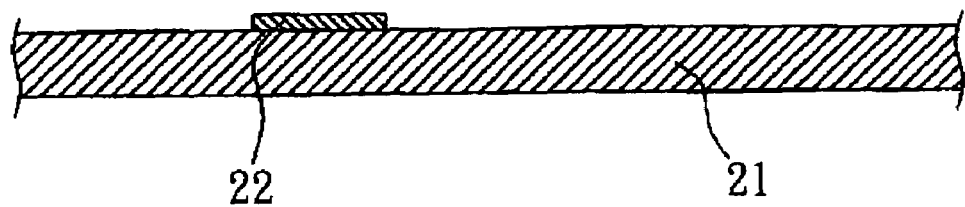
FIGS. 3a to 3r show a method for forming a redistribution layer in a wafer structure according to the preferable embodiment of the present invention.
Figure 3B:
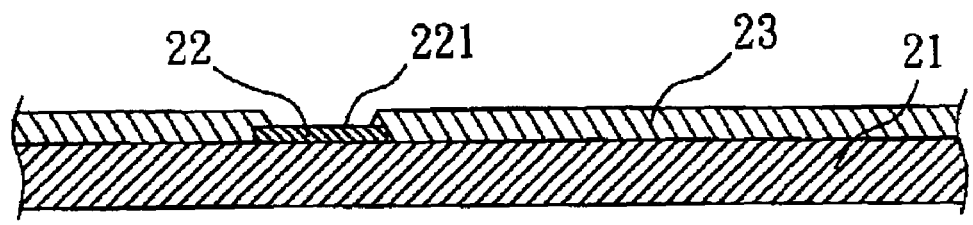
Figure 3C:
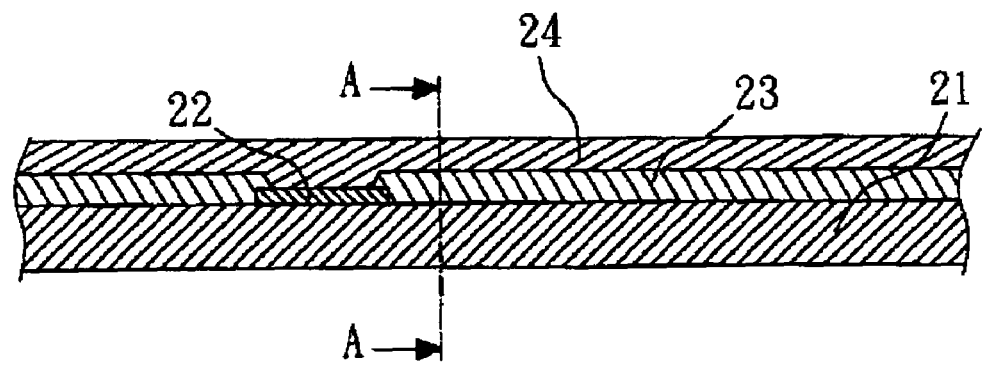
Figure 3D:
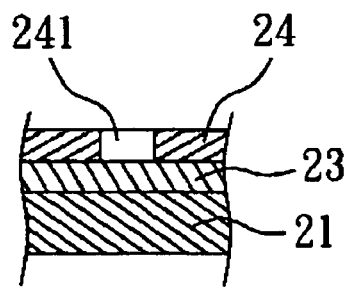
Figure 3G:
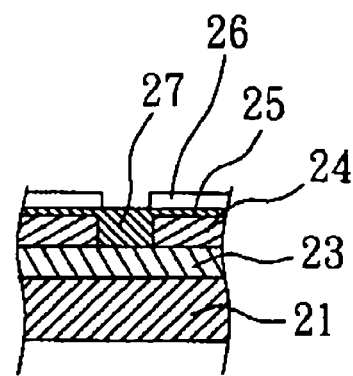
Figure 3E:
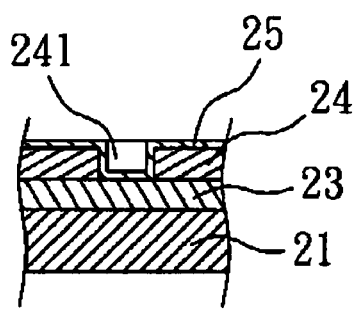
Figure 3H:
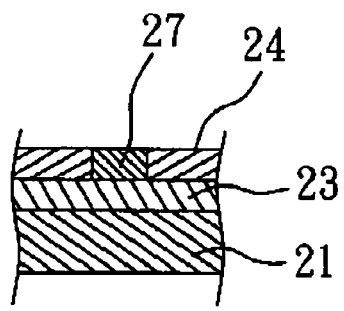
Figure 3F:
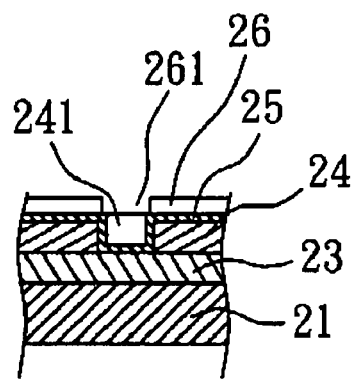
Figure 3I:
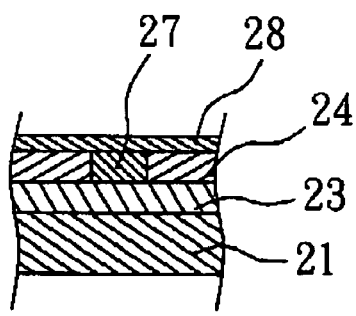
Figure 3J:
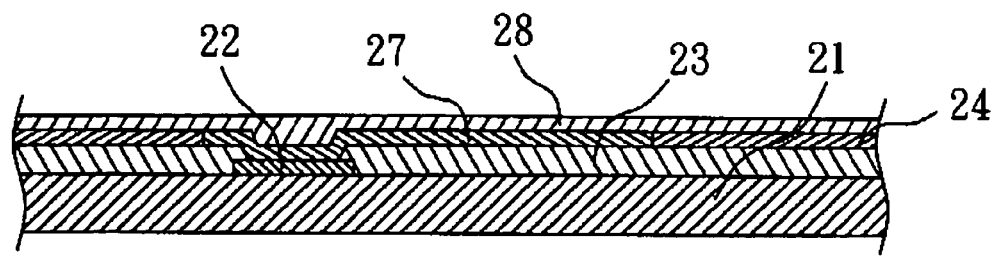
Figure 3K:
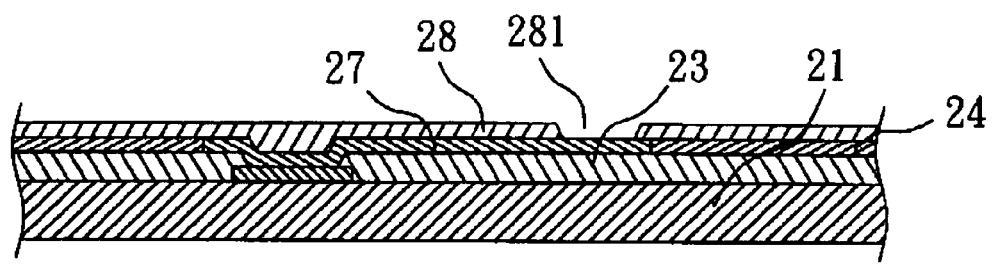
Figure 3L:
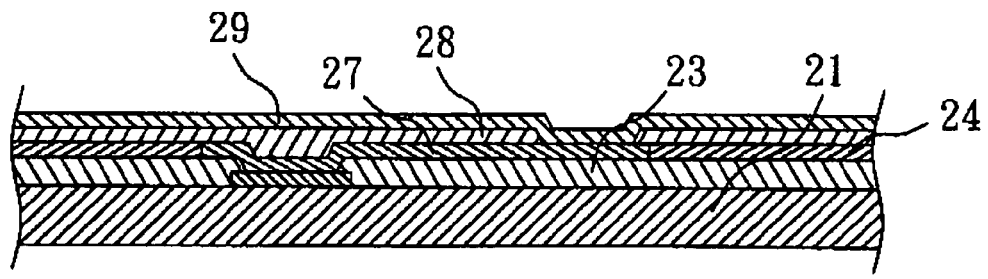
Figure 3M:
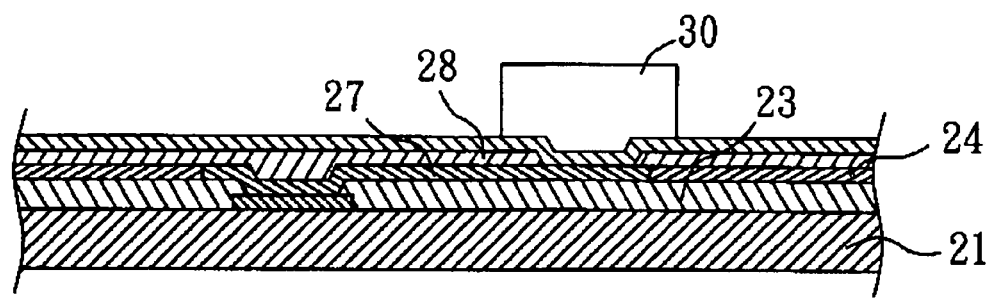
Figure 3N:
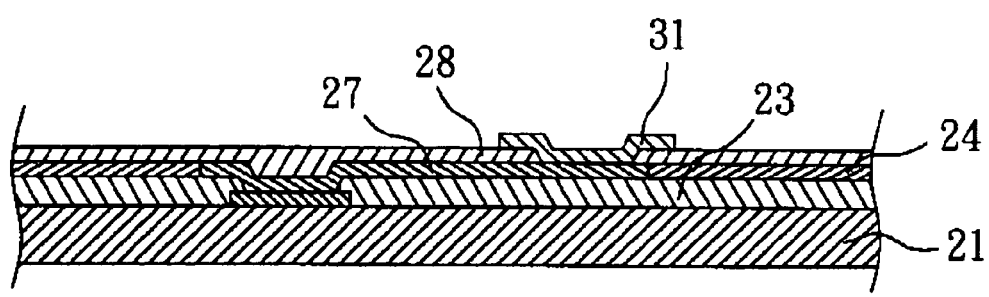
Figure 3O:
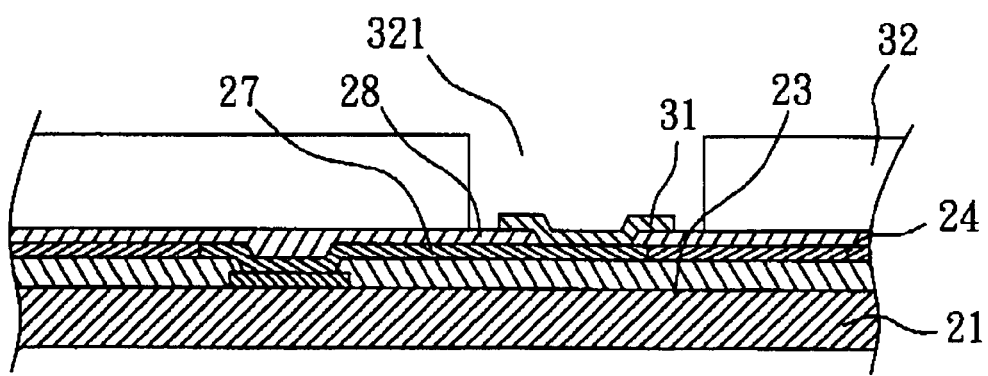
Figure 3P:
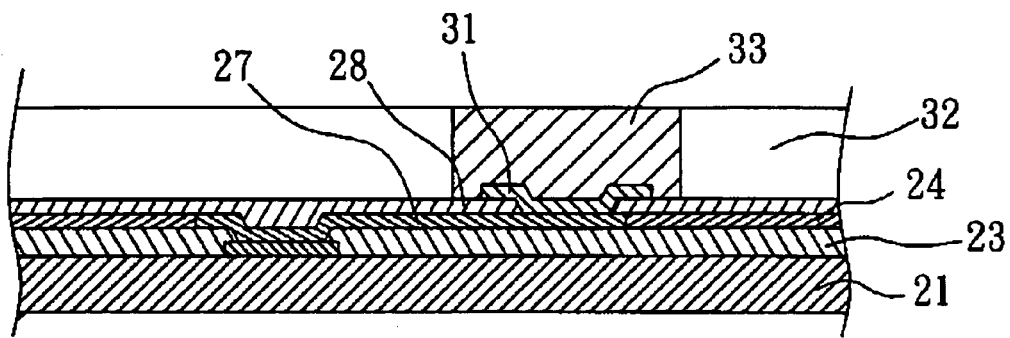
Figure 3Q:
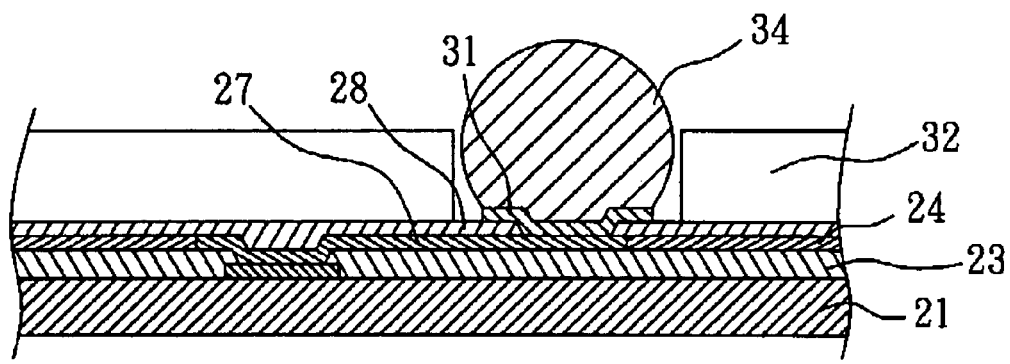
Figure 3R:
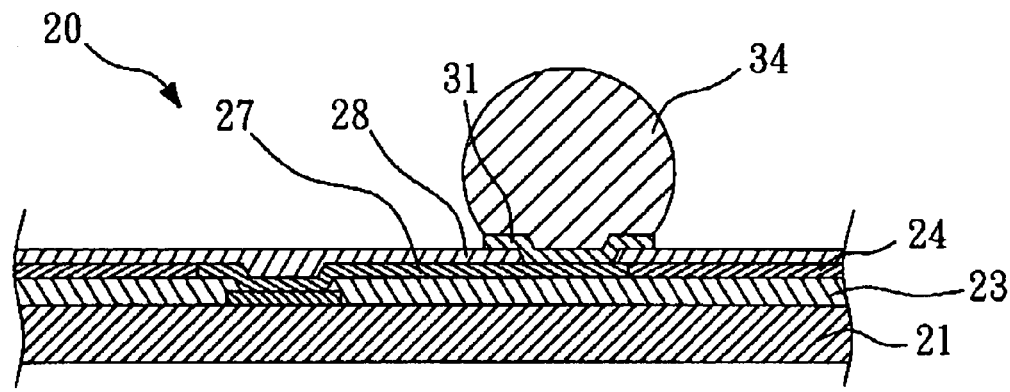

FIGS. 3a to 3r show a method for forming a redistribution layer in a wafer structure according to the preferable embodiment of the present invention. The method according to the present invention is described as follows. First, a wafer 21 having a plurality of conductive structures, for example, bonding pads 22, is provided, as shown in FIG. 3a. A first passivation layer 23 is then formed by coating or deposition on the wafer 21 to protect the wafer 21. The first passivation layer 23 does not cover the top surfaces of the bonding pads 22 completely but exposes the conductive surface 221 of the bonding pads 22, as shown in FIG. 3b. A second passivation layer 24 is then formed by coating or deposition over the first passivation layer 23 and covers the bonding pads 22, as shown in FIG. 3c.

Next, FIGS. 3d to 3i show the cross sectional view taken along line A—A of FIG. 3c. Part of the second passivation layer 24 is selectively removed by utilizing exposing and development technique so that the second passivation layer 24 has a plurality of grooves 241 corresponding to a predetermined circuit, wherein the grooves 241 pass over the bonding pads 22 and expose the conductive surfaces 221 (FIG. 3b) of the bonding pads 22, as shown in FIG. 3d. In other words, the grooves 241 extend from an exposed portion of the second passivation layer 24, which exposes the conductive surfaces 221 of the bonding nads 22, to another portion of the second passivation layer 24, other than the exposed portion. A seed layer 25 is then formed on the sidewalls of the grooves 241 by electro-less plating, sputtering, chemical vapor deposition or physical vapor deposition, as shown in FIG. 3e. The material of the seed layer 25 can be aluminum, copper or the like. Then, a photoresist film 26, for example, a dry film or a liquid photo resist layer, is applied to the seed layer 25. By an appropriate way, for example, patterning, a plurality of openings 261 corresponding to the grooves 241 are formed on the photoresist film 26 so as to expose the seed layer 25 in the grooves 241, as shown in FIG. 3f. Then, a metal material is fulfilled in the grooves 241 by electroplating or electrodepositing so as to form a redistribution layer 27. The material of the redistribution layer 27 is the same as that of the seed layer 25, which is aluminum, copper or the like, as shown in FIG. 3g. Then, the photoresist film 26 is stripped and the excessive material of the redistribution layer 27 is etched back. The redistribution layer 27 does not extend out of the grooves 241 in relation to a top surface of the second passivation layer 24. Preferably, the top surface of the redistribution layer 27 and the top surface of the second passivation layer 24 are on the same horizontal plane, as shown in FIG. 3h. Accordingly, the redistribution layer 27 is "embedded" in the second passivation layer 24 so that the redistribution layer 27 is fixed in the second passivation layer 24 tightly and the delamination of the redistribution layer 27 can be avoided.

Then, a third passivation layer 28 is formed over the second passivation layer 24 and the redistribution layer 27, as shown in FIG. 3i.

Next, the view angle of FIGS. 3j to 3r is same as that of FIG. 3c. Taking FIGS. 3i and 3j for example, they show the same structure from a different view angle.

Part of the third passivation layer 28 is selectively removed by utilizing exposing and development technique so that the third passivation layer 28 has a plurality of openings 281 to expose part of the redistribution layer 27, as shown in FIG. 3k. Then, a conductive layer 29 is formed over the third passivation layer 28 by sputtering, as shown in FIG. 3l.

A photoresist film, for example, a dry film or a liquid photo resist layer, is applied to the conductive layer 29. By an appropriate way, for example, patterning, a plurality of openings are defined on the photoresist film. The photoresist film is selectively removed so that a patterned photoresist film 30 remains on the opening 281, as shown in FIG. 3m. Then, the conductive layer 29 is patterned by etching according to the mask of the patterned photoresist film 30. For example, part of the conductive layer 29 is removed by wet etching, and the conductive layer 29 on the opening 281 remains to form a under bump metallurgy layer 31, then the patterned photoresist film 30 is stripped, as shown in FIG. 3n.

Referring to FIG. 3o, the entire surface is covered by another photoresist film 32 on which an opening 321 corresponding to a solder bump 34 (FIG. 3q) is formed by patterning. Then, a silver paste 33 is filled in the opening 321 by screen printing, as shown in FIG. 3p. The solder bump 34 is made of the silver paste 33 after reflow, as shown in FIG. 3q. Finally, the wafer structure 20 is formed after the photoresist film 32 is stripped, as shown in FIG. 3r.

FIG. 3r shows the wafer structure 20 according to the preferable embodiment of the present invention. The wafer structure 20 comprises a wafer 21, a plurality of bonding pads 22, a first passivation layer 23, a second passivation layer 24, a redistribution layer 27, a third passivation layer 28, a under bump metallurgy layer 31 and a solder bump 34.

The bonding pads 22 are disposed on a surface of the wafer 21, and the material the bonding pads 22 is usually aluminum, copper or the like. The first passivation layer 23 covers the wafer 21 and part of each bonding pads 22 so as to expose a conductive surface on each bonding pads. That is, the first passivation layer 23 does not cover the top surfaces of the bonding pads 22 completely. The material of the first passivation layer 23 is usually benzocyclobutene (BCB), polyimide (PI) or the like. The second passivation layer 24 is disposed over the first passivation layer 23 and has a plurality of grooves corresponding to a predetermined circuit, wherein the grooves expose the conductive surfaces of the bonding pads 22. The material of the second passivation layer 24 is usually benzocyclobutene (BCB), polyimide (PI) or the like. The redistribution layer 27 is disposed in the grooves and is used for electrically connecting the bonding pads 22 and the under bump metallurgy layer 31. The material of the redistribution layer 27 is usually aluminum. Preferably, the top surface of the redistribution layer 27 and the top surface of the second passivation layer 24 are on the same horizontal plane. The third passivation layer 28 is disposed over the second passivation layer 24 and the redistribution layer 27 to protect the redistribution layer 27. The material of the third passivation layer 28 is usually benzocyclobutene (BCB), polyimide (PI) or the like. The under bump metallurgy layer 31 is disposed on a predetermined location over the third passivation layer 28 and is electrically connected to the redistribution layer 27. The solder bump 34 is formed on the under bump metallurgy layer 31. The under bump metallurgy layer 31 includes an adhesion layer, a barrier layer and a wetting layer (not shown), and is used for enhancing the attachment between the solder bump 34 and the redistribution layer 27. The material of the solder bump 34 is usually tin/lead alloy.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A method for forming a redistribution layer in a wafer structure comprising:
   (a) providing a wafer having a plurality of conductive structures and a first passivation layer thereon, wherein the first passivation layer covers the wafer except conductive surfaces of the conductive structures;
   (b) forming a second passivation layer over the first passivation layer;
   (c) selectively removing part of the second passivation layer to form a plurality of grooves corresponding to a predetermined circuit, wherein the grooves extend from an exposed portion of the second passivation layer, which exposes the conductive surfaces of the conductive structures, to another portion of the second passivation layer other than the exposed portion;
   (d) forming a redistribution layer in the grooves, wherein the redistribution layer does not extend out of the grooves in relation to a top surface of the second passivation layer; and
   (e) forming a third passivation layer over the second passivation layer and the redistribution layer.

2. The method according to claim 1, wherein the step (d) is filling a conductive material in the grooves to form the redistribution layer.

3. The method according to claim 2, wherein the step (d) is electrodepositing a metal material in the grooves.

4. The method according to claim 1, wherein the step (d) comprises:
   (d1) forming a seed layer on the sidewalls of the grooves;
   (d2) applying a photoresist film to the seed layer; and
   (d3) selectively removing part of the photoresist film to form a plurality of openings corresponding to the grooves so as to expose the seed layer in the grooves;
   (d4) electroplating a metal material in the grooves to form the redistribution layer.

5. The method according to claim 4, wherein the step (d) further comprises:
   (d5) stripping the photoresist film; and
   (d6) etching back an excessive portion of the redistribution layer such that the top surface of the redistribution layer and a top surface of the second passivation layer are on the same horizontal plane.

6. The method according to claim 4, wherein the photoresist film is a dry film.

7. The method according to claim 1, wherein the material of the first passivation layer is selected from the group consisting of benzocyclobutene (BCB) and polyimide (PI).

8. The method according to claim 1, wherein the material of the second passivation layer is selected from the group consisting of benzocyclobutene (BCB) and polyimide (PI).

9. The method according to claim 1, wherein the material of the third passivation layer is selected from the group consisting of benzocyclobutene (BCB) and polyimide (PI).

10. The method according to claim 1, wherein the material of the redistribution layer is aluminum.

11. The method according to claim 1, wherein the conductive structures are bonding pads.

12. A method for forming a wafer structure comprising:
    (a) providing a wafer having a plurality of conductive structures and a first passivation layer thereon, wherein the first passivation layer covers the wafer except conductive surfaces of the conductive structures;
    (b) forming a second passivation layer over the first passivation layer;
    (c) selectively removing part of the second passivation layer to form a plurality of grooves corresponding to a predetermined circuit, wherein the grooves expose the conductive surfaces of the conductive structures;
    (d) forming a redistribution layer in the grooves; and
    (e) forming a third passivation layer over the second passivation layer and the redistribution layer;
    (f) selectively removing part of the third passivation layer to form a plurality of openings to expose part of the redistribution layer;
    (g) forming a under bump metallurgy layer over the third passivation layer and the openings; and
    (h) forming a solder bump on the under bump metallurgy layer.

13. The method according to claim 12, wherein the step (d) is filling a conductive material in the grooves to form the redistribution layer.

14. The method according to claim 12, wherein the step (d) comprises:
    (d1) forming a seed layer on the sidewalls of the grooves;
    (d2) applying a photoresist film to the seed layer, the photoresist film having a plurality of openings corresponding to the grooves so as to expose the seed layer in the groove; and
    (d3) electroplating and fulfilling a metal material in the grooves to form the redistribution layer.

15. The method according to claim 14, wherein the step (d) further comprises:
    (d4) stripping the photoresist film; and
    (d5) etching back an excessive portion of the redistribution layer such that the top surface of the redistribution layer and a top surface of the second passivation layer are on the same horizontal plane.

* * * * *